United States Patent
Kou et al.

(10) Patent No.: US 11,884,497 B2
(45) Date of Patent: Jan. 30, 2024

(54) COMPONENT REEL PICKING

(71) Applicants: ACCU-ASSEMBLY INCORPORATED, Andover, MA (US); ASCENTEX INDUSTRY CORPORATION, Taipei (TW)

(72) Inventors: Yuen-Foo Michael Kou, Andover, MA (US); Min Chieh Chang, Taipei (TW)

(73) Assignees: Accu-Assembly Incorporated, Andover, MA (US); Ascentex Industry Corporation, Taipei (TW)

( * ) Notice: Subject to any disclaimer, the term of this patent is extended or adjusted under 35 U.S.C. 154(b) by 593 days.

(21) Appl. No.: 17/054,721

(22) PCT Filed: Dec. 31, 2019

(86) PCT No.: PCT/US2019/069063
§ 371 (c)(1),
(2) Date: Nov. 11, 2020

(87) PCT Pub. No.: WO2020/142488
PCT Pub. Date: Jul. 9, 2020

(65) Prior Publication Data
US 2021/0245975 A1    Aug. 12, 2021

Related U.S. Application Data

(60) Provisional application No. 62/787,632, filed on Jan. 2, 2019.

(51) Int. Cl.
*B65G 59/02* (2006.01)
*H05K 13/02* (2006.01)

(52) U.S. Cl.
CPC .......... *B65G 59/02* (2013.01); *H05K 13/021* (2013.01)

(58) Field of Classification Search
CPC .............................. B65G 59/02; H05K 13/021
(Continued)

(56) References Cited

U.S. PATENT DOCUMENTS

| 4,199,183 A | 4/1980 | Hecker |
| 5,486,081 A * | 1/1996 | Draghetti ............. B65G 59/045 414/797 |

(Continued)

FOREIGN PATENT DOCUMENTS

| CN | 1799102 | 7/2006 |
| CN | 102348483 | 2/2012 |

(Continued)

OTHER PUBLICATIONS

Office Action in Taiwanese Appln. No. 108148592, dated Apr. 12, 2023, 14 pages (with English translation).

(Continued)

*Primary Examiner* — Lynn E Schwenning
(74) *Attorney, Agent, or Firm* — Fish & Richardson P.C.

(57) ABSTRACT

A method of picking a top component reel from a stack of component reels includes lowering a picking arm over a rod extending through the stack of component reels to above a top component reel of the stack, the arm comprising a plurality of alignment tabs and a gripper positioned such that, with the picking arm lowered the rod extends through the gripper and between the alignment tabs of the picking arm. The method includes actuating the alignment tabs to engage the rod and align the rod with respect to the picking arm, inserting a portion of the gripper into a hole of the top component reel, actuating the gripper to engage opposing inner surfaces of the top component reel at the hole of the top component reel, and with the gripper engaged, raising the picking arm to lift the top component reel from the stack of component reels.

39 Claims, 9 Drawing Sheets

(58) Field of Classification Search
USPC .............................. 414/796.9; 294/87.1, 195
See application file for complete search history.

(56) References Cited

U.S. PATENT DOCUMENTS

| | | | |
|---|---|---|---|
| 5,934,865 | A | 8/1999 | Meadows |
| 6,276,628 | B1 | 8/2001 | Focke et al. |
| 6,820,741 | B2 * | 11/2004 | Ferguson ............ G11B 33/0477 |
| 2003/0002400 | A1 * | 1/2003 | Klein ..................... G11B 23/40 |
| | | | 369/30.55 |
| 2016/0378088 | A1 | 12/2016 | Son |

FOREIGN PATENT DOCUMENTS

| | | |
|---|---|---|
| CN | 108827983 | 11/2018 |
| CN | 208070885 | 11/2018 |

OTHER PUBLICATIONS

International Search Report and Written Opinion in International Appln. No. PCT/US2019/069063, dated Mar. 25, 2020, 10 pages.
Office Action in Chinese Appln. No. 201980092319.2, dated Oct. 25, 2022, 14 pages (with English translation).

* cited by examiner

COMPONENT REEL PICKING

CROSS-REFERENCE TO RELATED APPLICATIONS

This application is a U.S. National Stage Application under 35 USC § 371 and claims the benefit of International Patent Application Serial No. PCT/US2019/069063 filed on Dec. 31, 2019, which claims the benefit of U.S. Provisional Patent Application Ser. No. 62/787,632 filed on Jan. 2, 2019. The disclosures of the foregoing applications are incorporated herein by reference in their entirety.

TECHNICAL FIELD

This invention relates generally to methods of picking stored objects, and more particularly to picking component reels from a stack of component reels.

BACKGROUND

Retrieving items stored in large stacks of items can present many challenges. In some cases, the items must be quickly picked from a stack to supply the items in a manufacturing process. Retrieving items from the stack can be challenging especially considering that each item can be of different size and can be misaligned within the stack. Methods and systems for improving the process of picking component reels are sought.

SUMMARY

One aspect of the invention features a method of picking a top component reel from a stack of component reels. The method includes lowering a picking arm over a rod that extends through the stack of component reels to above a top component reel of the stack, where the arm includes a gripper positioned such that, with the picking arm lowered the rod extends through the gripper of the picking arm. The rod is aligned with respect to the picking arm, and then, with the rod aligned, a portion of the gripper is inserted into a hole defined in the top component reel. The gripper is actuated to engage opposing inner surfaces of the top component reel at the hole of the top component reel, and with the gripper engaging the opposing inner surfaces, the picking arm is raised to lift the top component reel from the stack of component reels.

In some implementations, the arm further includes multiple tabs positioned such that, with the picking arm lowered, the rod extends through the tabs. Aligning the rod includes actuating the tabs to engage the rod and align the rod with respect to the picking arm.

In some examples, the tabs are gripping tabs of the gripper. In some examples, aligning the rod includes actuating the gripping tabs to substantially dispose the gripping tabs within respective longitudinal grooves of the rod to align the rod through engagement of the grooves. In some examples, inserting a portion of the gripper into the hole of the top component reel includes continuing to lower the picking arm as the gripping tabs are substantially disposed within respective longitudinal grooves of the rod to insert the gripping tabs into the hole of the top component reel.

In some cases, the gripper includes two opposing jaws each having a gripping tab arranged to fit substantially within a respective longitudinal groove of the rod, and actuating the gripper includes expanding a gap between the jaws such that each gripping tab moves from a respective groove of the rod to engage a respective one of the opposing inner surfaces.

In some cases, the rod has a minimum web thickness, measured between bases of the longitudinal grooves, of less than about 40% of the diameter of the rod.

In some cases, the tabs are alignment tabs positioned between the gripper and the picking arm. In some implementations, the alignment tabs include a first pair of opposing, parallel tabs disposed above a second pair of opposing, parallel tabs, where the first pair of tabs extends in a direction perpendicular to the second pair of tabs. In some arrangements, actuating the alignment tabs to align the rod includes moving at least one of two opposing tabs to narrow a gap between the two opposing tabs. In one example, the alignment tabs include rollers. In another implementation, the gripper includes two opposing jaws each including an arched gripping tab, and actuating the gripper includes expanding a gap between the jaws such that each gripping tab engages a respective one of the opposing inner surfaces.

In some cases, prior to inserting the portion of the gripper into the hole of the top component reel, two jaws are actuated to narrow a gap between the two respective gripping tabs to embrace the rod with the gripping tabs In some examples, the picking arm defines an aperture configured to receive the rod as the picking arm is lowered over the rod. In some cases actuating the tabs includes aligning the rod with respect to the aperture of the picking arm.

Still in other implementations, the rod extends through aligned holes of the stack of component reels.

In some cases, the rod extends through center holes of the stack of component reels.

In some instances, the hole of the top component reel is a center hole.

In various implementations, inserting a portion of the gripper into the hole of the top component reel includes continuing to lower the picking arm to insert a portion of the gripper into the hole of the top component reel.

Another aspect of the invention features a method of picking a top component reel from a stack of component reels. The method includes lowering a picking arm over a rod that defines longitudinal grooves. The rod extends through the stack of component reels to above a top component reel of the stack. The arm includes a gripper positioned such that, with the picking arm lowered the rod extends through the gripper of the picking arm. The method also includes positioning a portion of the gripper substantially within the grooves. The method also includes inserting the portion of the gripper into a hole of the top component reel by moving the portion of the gripper along the grooves. The method further includes actuating the gripper to engage opposing inner surfaces of the top component reel at the hole of the top component reel, and then with the gripper engaging the opposing inner surfaces, raising the picking arm to lift the top component reel from the stack of component reels.

In some implementations, the gripper includes two opposing jaws each having a gripping tab. In such implementations, positioning a portion of the gripper substantially within the grooves includes positioning the gripping tabs substantially within the grooves of the rod.

Another aspect of the invention features a component reel picking system that includes a base, a rod, and a component reel pick assembly. The base is configured to support a vertical stack of component reels and the rod extends from the base and is positioned to extend through aligned holes of a vertical stack of component reels supported on the base. The component reel pick assembly includes a controllably movable picking arm, a plurality of tabs carried by the picking arm with the tabs spaced apart to receive the rod therebetween as the picking arm is lowered over a distal end of the rod. The tabs are actuatable to engage opposite sides of the rod to align the arm and the rod with the picking arm lowered. The component reel pick assembly further includes a reel gripper carried by the picking arm and includes two portions configured to receive the rod therebetween as the arm is lowered. The reel gripper is operable to separate the portions to receive the rod, and then to narrow a gap between the portions to insert the portions into a top reel of a vertical stack of reels supported on the base, and then to expand the gap to grip opposing surfaces of the top reel, such that subsequent raising of the arm lifts the top reel from the stack.

In some cases, the rod defines two opposite grooves each configured to receive a respective one of the two portions of the reel gripper. In some examples, the rod has a minimum web thickness, measured between bases of the longitudinal grooves, of less than about 40% of the diameter of the rod.

In some examples, the plurality of tabs are gripping tabs of the reel gripper. In some cases, the two portions of the reel gripper include two gripping tabs arranged to fit substantially within a respective groove of the rod, and the reel gripper is operable to expand a gap between the gripping tabs such that each of the two gripping tabs moves away from the respective groove to engage a respective one of the opposing surfaces of the top reel.

In some embodiments, the tabs include two sets of opposing alignment tabs disposed between the reel gripper and the picking arm. A first set of alignment tabs is disposed above a second set of alignment tabs, and the first set of alignment tabs extend in a direction perpendicular to the second set of alignment tabs such that the rod extends between each set of tabs when the tabs receive the rod. In some arrangements, the alignment tabs include rollers. In some cases, the reel gripper includes two opposing jaws each including one of the two portions of the reel gripper. The reel gripper is operable to expand a gap between the jaws such that each of the two portions engages a respective one of the opposing surfaces of the top reel.

In some implementations, the picking arm defines an aperture configured to receive the rod as the picking arm is lowered over the distal end of the rod. In some cases, the tabs are actuatable to aligning the rod with respect to the aperture of the picking arm.

In some implementations, the rod extends through center holes of the vertical stack of component reels.

In some instances, the hole of the top component reel is a center hole.

In some cases, the rod has an outer diameter of between 6 millimeters and 8 millimeters.

Another aspect of the invention features a component reel picking system that includes a base, a rod, and a component reel pick assembly. The base is configured to support a vertical stack of component reels and the rod extends from the base and is positioned to extend through aligned holes of a vertical stack of component reels supported on the base. The component reel pick assembly includes a controllably movable picking arm and a reel gripper carried by the picking arm. The reel gripper includes a plurality of fingers spaced apart to receive the rod therebetween as the arm is lowered. The fingers are controllably movable to engage opposite sides of the rod to align the rod with the picking arm. The reel gripper further includes opposing gripping tabs that extend downward and are movable between a closed position, in which the tabs fit within a central hole of a top reel of the vertical stack on either side of the rod, and an open position in which outer surfaces of the tabs grip the top reel within the central hole to lift the top reel from the stack with the picking arm.

In some instances, the picking arm includes an aperture configured to receive the rod as the picking arm is lowered over a distal end of the rod. In some examples, the fingers are actuatable to aligning the rod with respect to the aperture of the picking arm.

In many implementations, the fingers include two opposing sets of fingers disposed on a same plane to receive the rod between the two sets of fingers, each set of fingers including two pivotable fingers connected to a common pivot and configured to pivot in opposite directions about the pivot to align the rod.

In some cases, the gripping tabs move to the closed position as the fingers pivot to align the rod.

In some arrangements, the rod has an outer diameter of between 6 millimeters and 8 millimeters.

Aspects of the invention improve the process of picking top component reels from a stack of component reels by simplifying the steps and equipment needed, as well as automating the steps to increase efficiency of operations. The system of the present invention features a moving arm that helps align a rod that extends through the stack of component reels and, using the same moving arm, inserts gripping tabs of the arm into a hole of the top component reel to grab and pick the top component reel. Such features improves the reliability of the picking system by improving the chances that the moving arm will grip and pick the top component reel.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
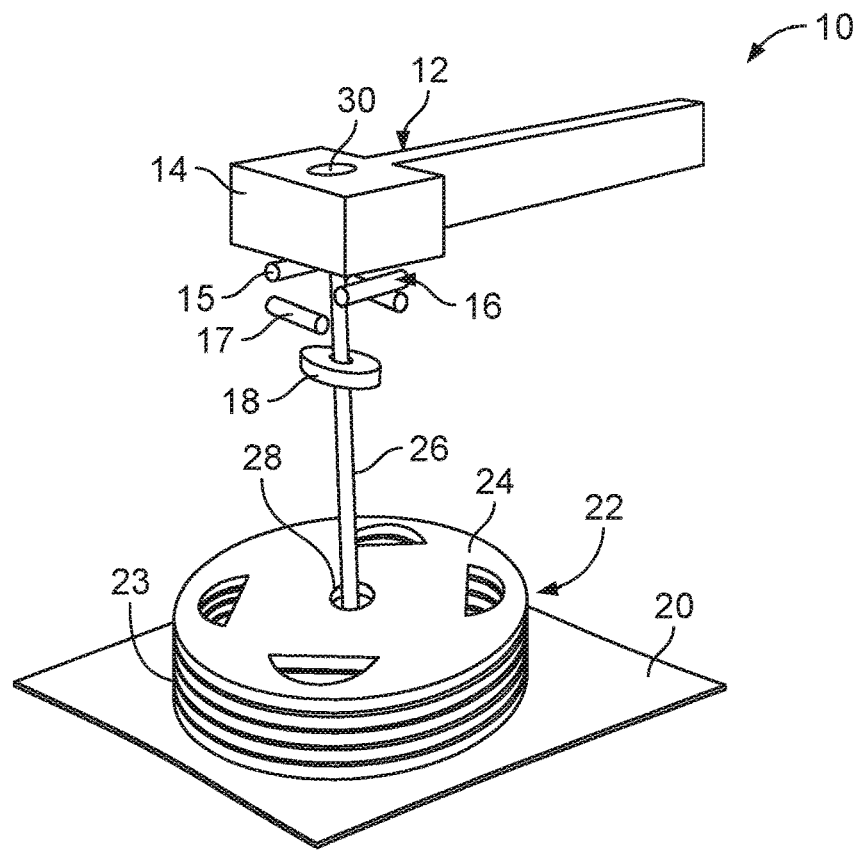
FIGS. 1-4 are sequential, perspective views of a component reel picking system picking a top component reel from a stack of component reels.

Referring to FIG. 1, a method and apparatus 10 for picking a top component reel 24 from a stack of component reels includes a picking assembly 12 and a stack 22 of component reels 23 supported on a base 20. Component reel picking system 10 is part of a storage system in a surface mount technology (SMT) facility. Component reels (also called tape reels) are used in production of electronic circuits, in which electronic components from tape reels are placed directly onto the surface of printed circuit boards. SMT board population requires many different components, and the specific list of components will change with each board design being produced. This requires manufacturers to maintain and manage inventories of hundreds, if not thousands, of different reels. Furthermore, partial reels often must be retrieved from and returned to inventory when switching from one run to the next. Automating and improving the process of picking component reels from a stack of component reels can increase the efficiency of operations and reduce manufacturing costs. The present invention aims to improve the process of picking top component reels from a stack of component reels.

Stack 22 of component reels 23 is supported on a base 20. A rod 26 extends from base 20 through aligned center holes 28 of component reels 23 to keep stack 22 from tipping over or falling. Rod 26 extends through stack 22 to above top component reel 24 to expose a distal end of the rod. Rod 26 can be a thin metal rod with a diameter that is about half the size of the diameter of center holes 28. Component reels 23 can be of different sizes (e.g., different diameters) and each may have a center hole 28 of different diameter. For example, the center hole 28 of each component reel 23 has a diameter of between 10 millimeters and 15 millimeters, and rod 26 has a diameter of between 5 millimeters and 8 millimeters. Rod 26 is susceptible to bending over time, which may cause misalignment of the stacked component reels 23 or may cause the rod to lean against a surface of the hole 28 of the reel 24. This bending and misalignment can present challenges when a picking arm is being lowered to pick a top component reel, and can prevent a gripper of the arm from engaging center hole 28 to pick the reel. As further discussed below, using actuatable alignment tabs or the gripper to align rod 26 can improve the process of picking top component reels from the stack.

FIGS. 1-4 sequentially illustrate a method for picking top component reel 24 from stack 22 using reel picking assembly 12. Referring specifically to FIG. 1, reel picking assembly 12 includes an automated movable arm 14 controllable to pick a top component reel 24 from stack 22. A mechanism (not shown) that moves the arm 14 can have a memory with information stored that includes a location of the stack 22 and a location of the central hole 28 of the top component reel 24, and can use such information to position arm 14 in substantially the same position every time the arm picks the top component reel. By positioning the arm in a predetermined location, the arm has a point of reference by which to align the rod 26. Reel picking arm 14 carries multiple tabs 16 (e.g., alignment tabs) and a reel gripper 18. As further discussed in detail below with respect to FIG. 2, picking arm 14 has an aperture 30 for receiving rod 26 when arm 14 is lowered to pick top component reel 24 from stack 22. Picking arm 14 can be moved to position gripper 18 and tabs 16 above rod 26, and to lower gripper 18 toward stack 22 to pick top component reel 24.

Figure 2:
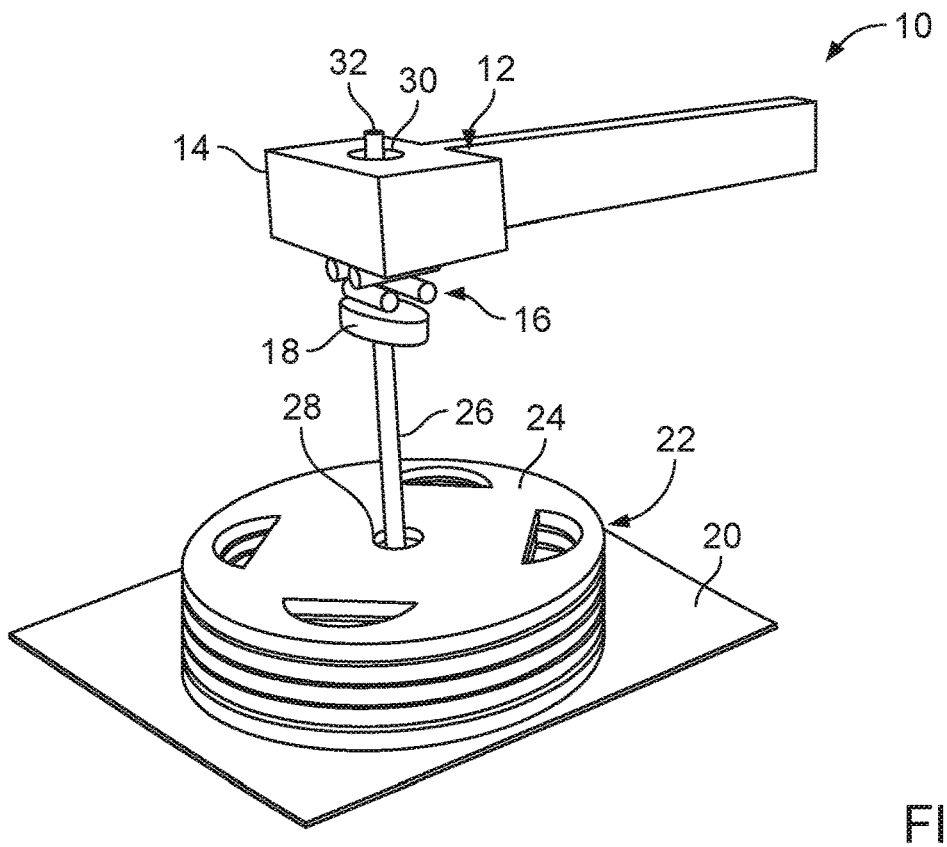

FIG. 1 illustrates alignment tabs 16 and gripper 18 in an exploded view to show the arrangement of each alignment tab with respect to picking arm 14. Alignment tabs 16 can be alignment rollers that are movable to engage opposite sides of rod 26 to align rod 26 with respect to arm 14. Alignment tabs 16 are disposed between arm 14 and gripper 18. Alignment tabs 16 include a first set 15 of spaced apart, opposing tabs and a second set 17 of spaced apart, opposing tabs below the first set 15 of tabs. Each set of tabs includes two tabs parallel to one another and actable to increase or decrease a gap between the tabs. Second set 17 of tabs extends perpendicular to first set 15 of tabs, with each tab arranged to leave a gap between opposite tabs to receive rod 26 as arm 14 is lowered over rod 26. Referring also to FIG. 2, tabs 16 receive rod 26 therebetween as picking arm 14 is lowered over a distal end 32 of rod 26. Aperture 30 of picking arm is aligned with the gap between tabs 16 to receive rod 26 as picking arm 14 is lowered over the rod. Tabs 16 can be actuated to engage rod 26 to align rod 26 with respect to aperture 30 of arm 14. In some cases, as rod 26 is aligned, stack 22 of component reels is also aligned with respect to gripper 18 to receive a portion of the gripper as the arm is lowered further toward the stack.

Figure 3:
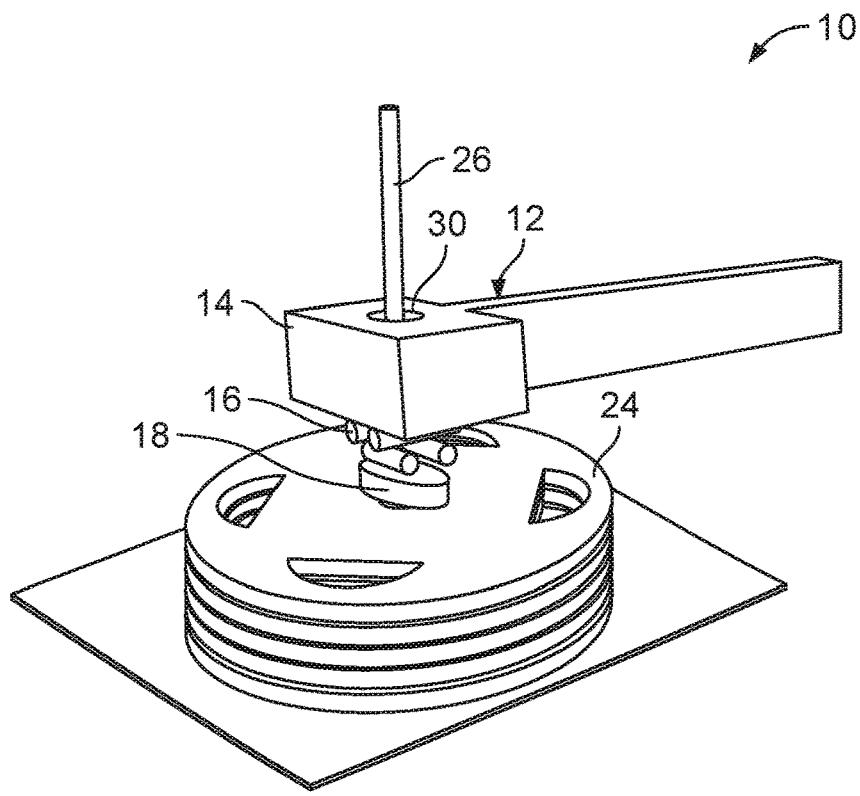
Figure 4:
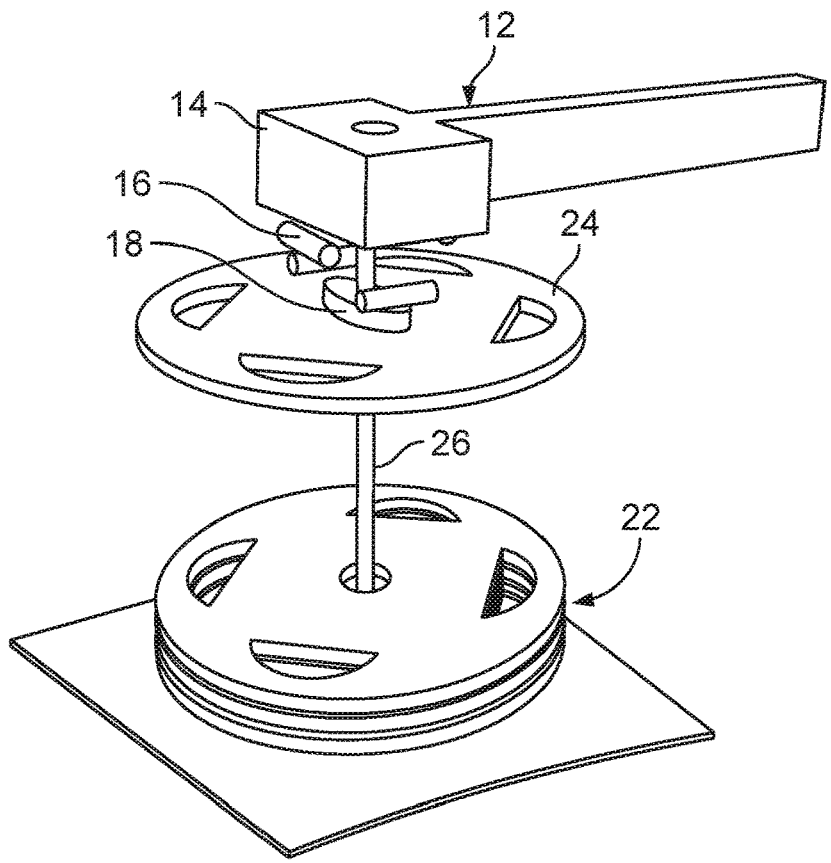

Reel gripper 18 moves independently from alignment tabs 16 to pick top component reel 24. As further discussed in detail with respect to FIGS. 5 and 6, reel gripper 18 includes two portions (shown in FIG. 5) configured to receive the rod therebetween as the arm is lowered. Reel gripper 18 is operable to separate the two portions to receive the rod as picking arm 14 is lowered over rod 26. In some examples, as alignment tabs 16 align rod 26, the rod moves top reel 24 by contacting its center hole 28 and aligning the hole with respect to gripper 18, which allows the gripper to pick top component reel 24. Referring now to FIG. 3, after rod 26 is aligned, picking arm 14 is further lowered toward top component reel 24. As arm 14 is lowered, alignment rollers 16 roll about rod 26 to keeping rod 26 aligned as the arm is lowered. Once gripper 18 is near top component reel 24, gripper 18 is actuated to reduce a gap between the two portions to insert a portion of gripper 18 into the center hole (not shown) of top reel 24. After gripper 18 is inserted into the center hole, gripper 18 is actuated to engage opposing surfaces of the hole of top component reel 24. With the surfaces of the top reel 24 engaged, arm 14 can be raised to pick top component reel 24, as shown in FIG. 4.

Figure 5:
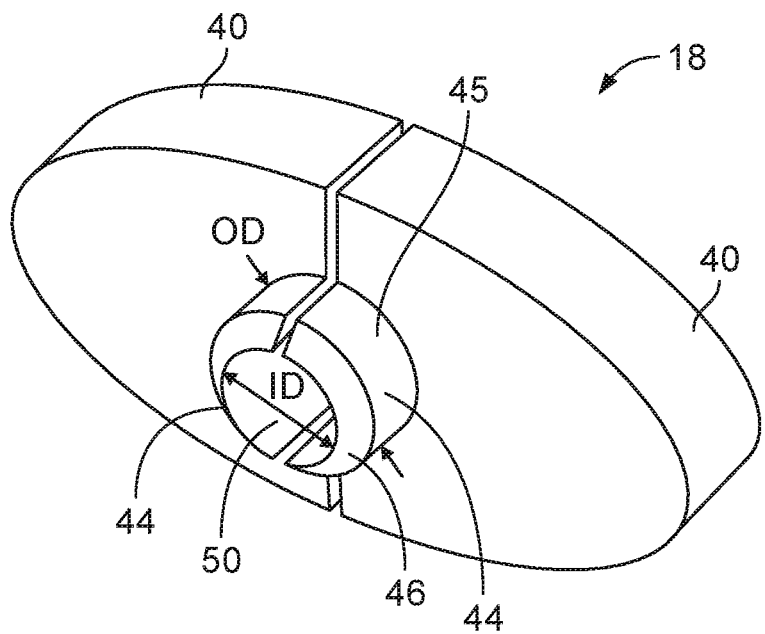
FIG. 5 is a perspective view of a closed component reel gripper.
Figure 6:
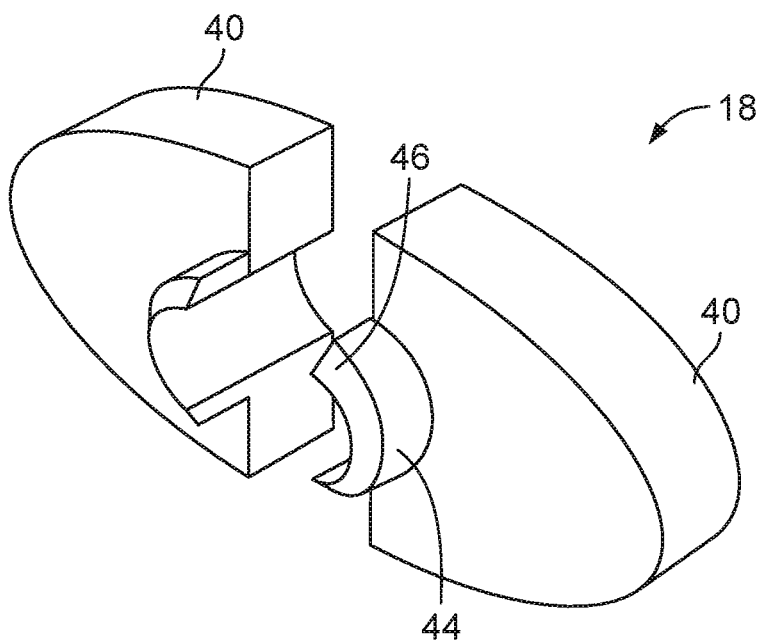
FIG. 6 is a perspective view of an opened component reel gripper.
Figure 6A:
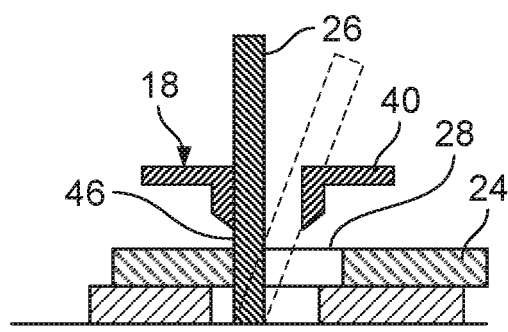
FIG. 6A is a cross-sectional view of alignment tabs being actuated to align the rod.

Referring to FIGS. 5 and 6, reel gripper 18 includes two jaws 40 of symmetrical shape that are movable to increase or decrease a gap between the jaws. Each jaw 40 has an arched gripping tab 44 configured to fit with the center hole of a component reel (shown in FIG. 1), between the rod and the walls of the center hole. Gripping tabs 44 have a rough outer surface 45 that allow the gripping tabs to firmly grip the walls of the center hole. Outer surface 45 can be threaded or coated, for example. In some cases, outer surface 45 can include a rubbery surface that prevents the reel from slipping. As shown in FIG. 5, when jaws 40 are brought together to narrow the gap between the jaws, gripping tabs 44 come together to form a cylindrical housing 50 having an internal diameter 'ID' of between 6 millimeters and 8 millimeters and an outer diameter 'OD' of between 11 millimeters and 13 millimeters. As further discussed in detail below with respect to FIGS. 11-14, the dimensions of gripping tabs 44 are such that when jaws 40 come together, housing 50 embraces the rod closely to allow housing 50 to be inserted into the hole of the top component reel. Referring also to FIG. 6A, when the rod is aligned by the alignment tabs, the hole 28 of top reel 24 may end in an offset position with a surface of the hole in contact with a side of rod 26. To pick top reel 24, gripping tabs 44 have to be inserted between the rod 26 and hole 28. As shown in FIG. 6, in such situations, gripping tabs 44 have a chamfered end 46 that allows gripper 18 to insert the tabs 44 into the hole by first contacting the surface of the rod with tabs 44, and then moving the tabs 44 along the rod to insert the distal end of gripping tab 44 between the hole and the rod. After tabs 44 are inserted into the hole of the top reel, gripper 18 can be actuated to expand a gap between jaws 40 to engage the hole of the top reel at opposite sides of the hole.

Figure 7:
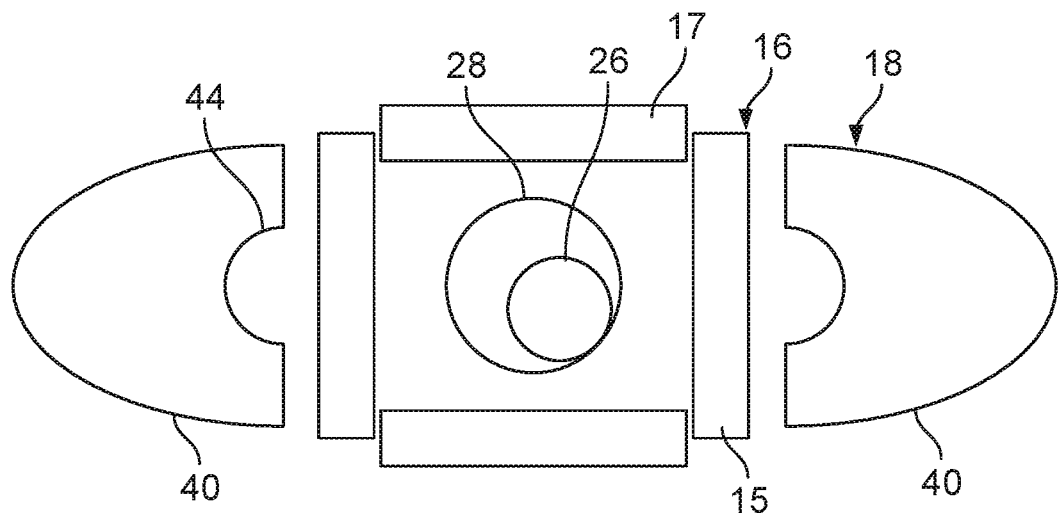
FIG. 7 is a top view of a gripper and alignment tabs in an open position.
Figure 8:
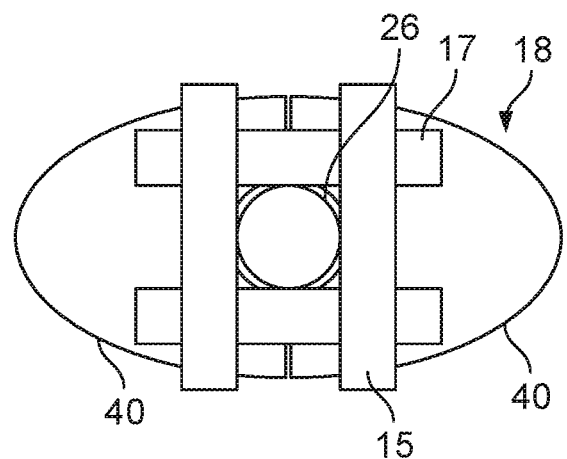
FIG. 8 is a top view of the gripper and alignment tabs in FIG. 7, in a closed position to align a rod.

FIGS. 7 and 8 illustrate how alignment rollers 16 move to align rod 26. Each pair 15 and 17 of alignment rollers is disposed on a different horizontal plane (not shown), with rollers 15 being on top of rollers 17. Top rollers 15 move in the same direction as jaws 40 to reduce a gap between top rollers 15. Bottom rollers 17 move in a direction perpendicular to the motion of jaws 40 to reduce a gap between bottom rollers 17. Each pair of rollers can be actuated at the same time to center rod with respect to the picking arm (not shown), or they can be actuated individually to align the rod as desired. Alignment rollers 16 may align rod 26 before gripper 18 is actuated. Gripper 18 can be actuated after the gripper and rollers have been lowered toward the top component reel. In some examples, the picking arm only includes bottom rollers 17 to align rod 26 in a direction perpendicular to jaws 40. In such arrangement, bottom rollers 17 would position rod 26 along the path of gripping tabs 44 so that at least one of the gripping tabs 44 would engage a side of rod 26 to align the rod in the direction of the reel gripper 18.

Figure 9:
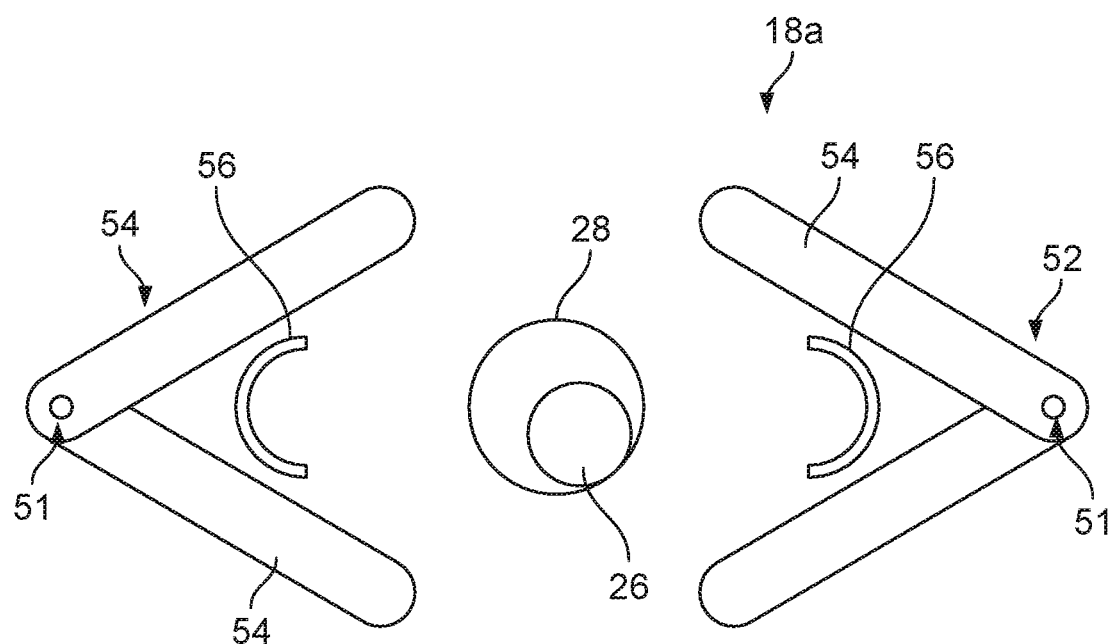
FIG. 9 is a top view of a gripper having alignment fingers in an open position.
Figure 10:
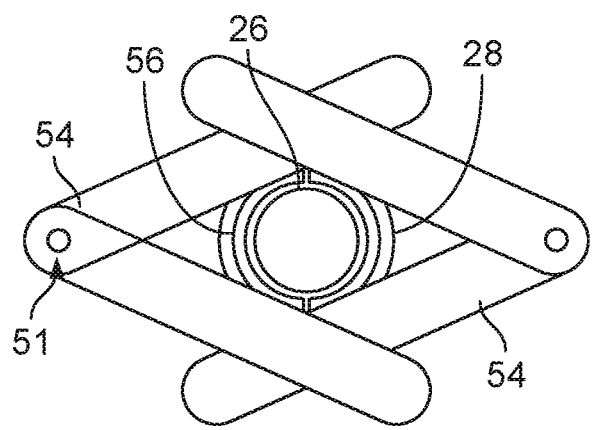
FIG. 10 is a top view of the gripper in FIG. 9, with the alignment fingers in a closed position to align the rod.

FIGS. 9 and 10 illustrate a different example of a reel gripper 18a. Reel gripper 18a includes two gripping tabs 56 and two sets of pivotable fingers 54 spaced apart to receive rod 26 therebetween as the arm is lowered. Each set of fingers is movable similar to scissors, with one of the fingers 54 disposed on top of another finger, both fingers 56 connected to and pivotable about a common pivot 51. Fingers 54 pivot in opposite directions about their respective pivots 51 to align rod 26. As shown in FIG. 10, each set of fingers can also move toward one another (e.g., in translation motion) to narrow a gap between gripping tabs 56. Both sets of fingers are disposed on the same plane such that each finger 54 engages opposite sides of the rod at a same height within the height of the rod to align the rod with the picking arm. In some examples, fingers 54 can also be pivotable rollers similar to the rollers in FIG. 7. Gripping tabs 56 are similar to the gripping tabs in FIG. 5, extending downward (e.g., toward hole 28) and arranged to engage opposing inner surfaces of the center hole of the top reel. As rod 26 is aligned, gripping tabs 56 come together into a closed position in which tabs 56 fit within central hole 28 of the top reel. Gripping tabs 56 can then be actuated into an open position in which outer surfaces of the tabs grip the top reel within the central hole 28 to lift the top reel from the stack with the picking arm. In some examples, fingers 54 are configured to move similar to the alignment rollers in FIGS. 7 and 8, moving in parallel motion instead of moving about a pivot.

Figure 11:
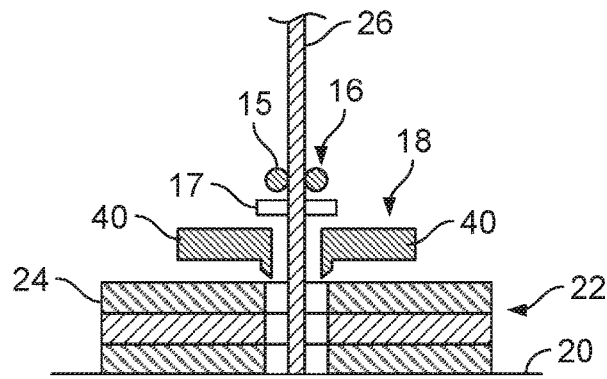
FIGS. 11-14 are sequential, cross-sectional views of a gripper and alignment tabs being actuated to pick a top component reel.
Figure 12:
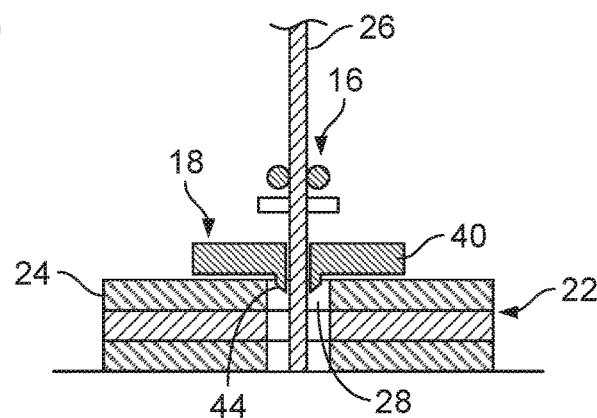
Figure 13:
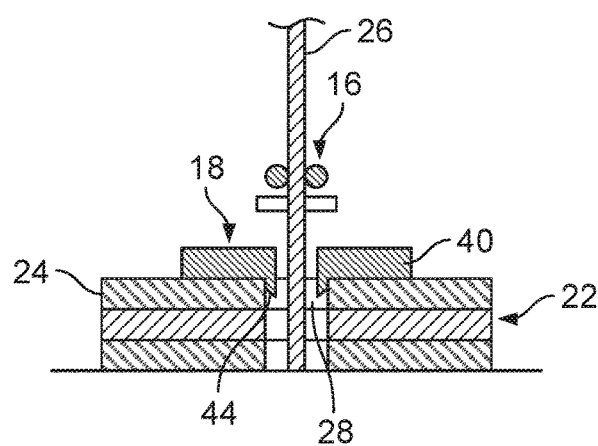
Figure 14:
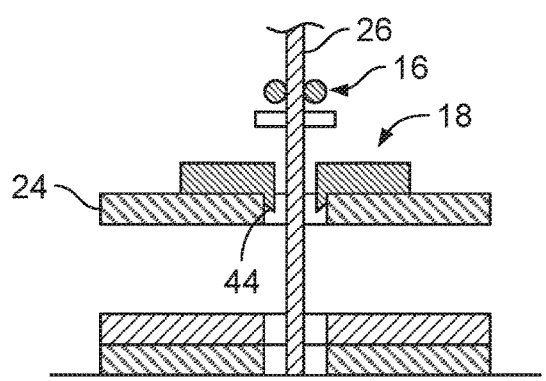

FIGS. 11-14 are sequential, cross-sectional views of a method of picking a top component reel 24 from a stack of component reels. For simplicity purposes, the picking arm that carries rollers 16 and gripper 18 is not shown. Referring to FIG. 11, after rod 26 has been aligned by rollers 16, rollers 16 and reel gripper 18 are lowered toward top component reel 24. Gripper 18 is in an open position to receive rod 26 between both jaws 40 as the gripper 18 and rollers 16 are moved downward. Referring to FIG. 12, jaws 40 of gripper 18 are brought together to embrace rod 26. As jaws are brought together, gripping tabs 44 embrace rod 26 allowing gripper 18 to be further lowered to insert gripping tabs 44 into hole 28. When gripper 18 is in a closed position and inserted into hole 28, tabs 44 may leave a gap between an outer surface of the tabs 44 and a surface of hole 28. As shown in FIG. 13, gripper 18 is actuated to expand a gap between jaws 40 so that gripping tabs 44 engage opposite surfaces of hole 28. As shown in FIG. 14, after gripper 18 engages top reel 24 by its central hole, gripper 18 picks top component reel 24 from stack 22 as gripper 18 and alignment tabs 16 are lifted from the stack of component reels.

Figure 15:
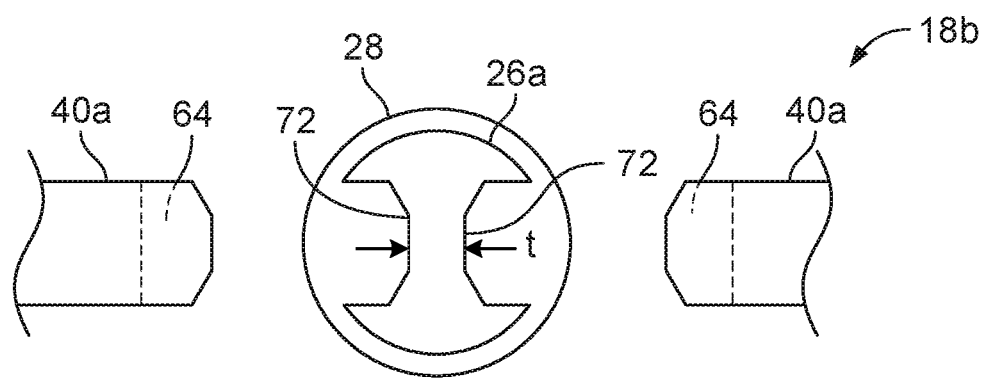
FIG. 15 is a top view of a gripper according to a different implementation.
Figure 16:
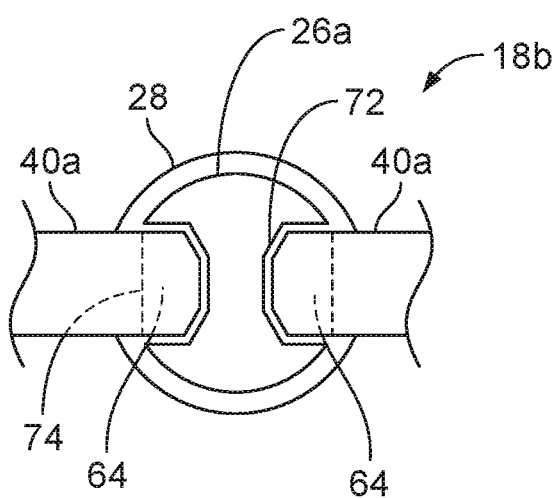
FIG. 16 is a top view of the gripper in FIG. 15, in a closed position.

FIGS. 15 and 16 illustrate a different example of a reel gripper 18b. Reel gripper 18b includes two opposing jaws 40a each having a tab 64 (e.g., a gripping tab) extending downward from an end of the jaw. In some implementations, a thick rod 26a can be used so that the rod remains generally straight or aligned, allowing gripper 18b to pick component reels without having to substantially align the rod (e.g., a gripper 18b without alignment tabs or pivotable fingers can be used), compared to the rod described with respect to FIGS. 1-14. Rod 26a defines longitudinal grooves 72 on opposite sides, for receiving the gripping tabs 64 of each jaw 40a. Rod 26a may have a minimum web thickness 't', measured between bases of the grooves, of less than about 40% of the outer diameter of the rod (e.g., about 34% of the diameter of the rod). To pick the reel, the arm (see FIGS. 1-4) carrying the gripper 18b can be first positioned such as to substantial align the gripping tabs 64 with the grooves 72. For example, before the arm is lowered over the rod 26a, the arm can be moved to a predetermined position and/or location that substantially aligns the tabs 64 with the grooves 72. The stability of rod 26 allows jaws 40a to quickly align with grooves 72 as jaws are actuated to move toward the rod 26a. Gripping tabs 64 are similar to the gripping tabs in FIG. 5, extending downward (e.g., toward hole 28) and arranged to engage the center hole of the top reel. Gripping tabs 64 are configured to fit substantially within the grooves. As jaws 40a are actuated toward the rod, gripping tabs 64 come together into a closed position in which tabs 64 are disposed substantially within grooves 72. Tabs 64 can also align rod 26a with respect to the arm by engaging the rod through the grooves 72 as the jaws move toward each other. As shown in FIG. 16, with the gripping tabs 64 positioned within grooves 72, jaws 40a can be lowered toward the top component reel to insert gripping tabs 64 into hole 28 of the top component reel. Once jaws 40a have been lowered, gripping tabs 64 can be actuated into an open position in which outer surfaces 74 of the tabs 64 grips the top reel within the central hole 28 to lift the top reel from the stack with the picking arm.

Figure 17:
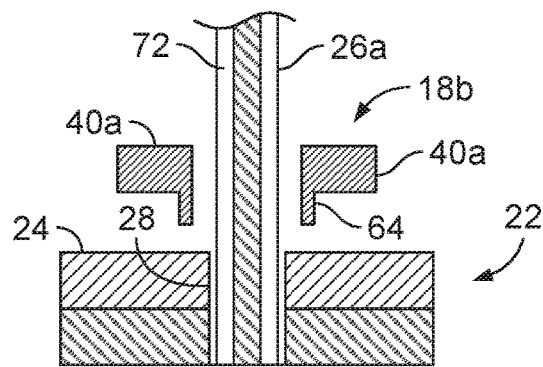
FIGS. 17-20 are sequential, cross-sectional views of a gripper being actuated to pick a top component reel, according to a different implementation.
Figure 18:
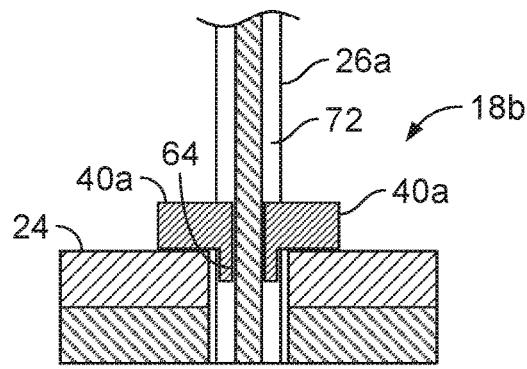
Figure 19:
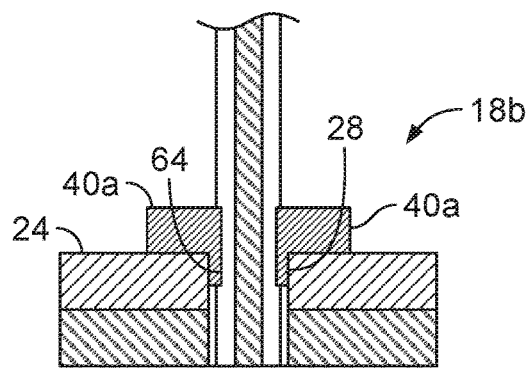

FIGS. 17-20 are sequential, cross-sectional views of a method of picking a top component reel 24 with the reel gripper 18b in FIGS. 15 and 16. For simplicity purposes, the picking arm that carries gripper 18b and the mechanisms that move the gripper are not shown. Referring to FIGS. 17 and 18, after the picking arm positions reel gripper 18b above top component reel 24, reel gripper 18b is lowered in an open position to receive rod 26a between both jaws 40a as the gripper 18b is moved downward. Jaws 40a of reel gripper 18b are brought together to position gripping tabs 64 within respective grooves 72 of rod 26a. As shown in FIG. 19, after gripping tabs 64 are within grooves 72, jaws 40a are further lowered to insert gripping tabs 64 into hole 28.

Figure 20:
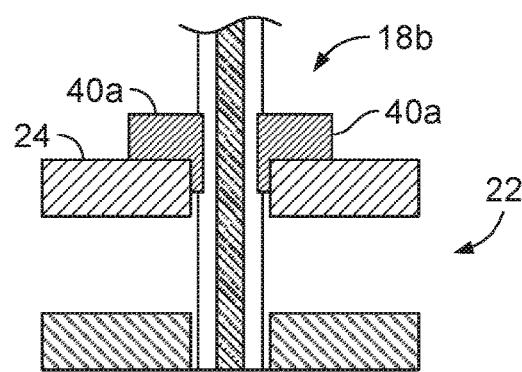

As jaws 40a are lowered, gripping tabs 64 remain positioned generally within groove 72 to be inserted into the hole 28. When tabs 64 are inserted into hole 28, tabs 64 may leave a small gap between an outer surface of the tabs 64 and a surface of hole 28. Gripper 18b is actuated to expand a gap between jaws 40a so that gripping tabs 64 engage opposing inner surfaces of hole 28. As shown in FIG. 20, after gripper 18b engages top reel 24 by its central hole, gripper 18b picks top component reel 24 from stack 22 as gripper 18b is lifted from the stack of component reels.

Figure 21:
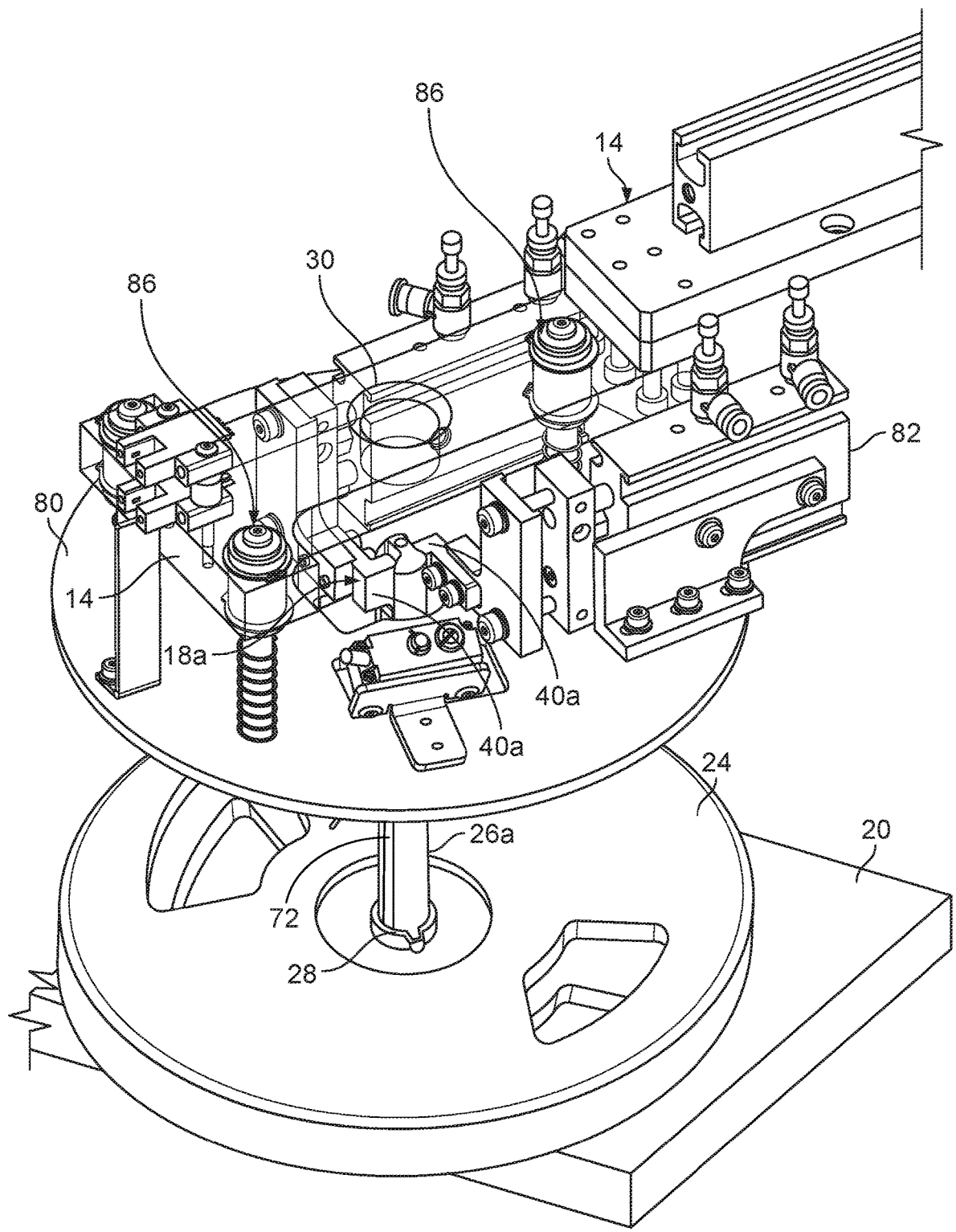
FIG. 21 is a perspective view of a component reel picking system according to an exemplary implementation.

FIG. 21 shows an exemplary embodiment of a reel picking system that uses the reel gripper of FIGS. 15-20. The reel picking system includes a picking arm 12 carrying a disc 80 that supports the mechanisms that move reel gripper 18b. Arm 14 can move in a translation and rotation motion to move reel gripper 18b toward and away from rod 26a, and to align the reel gripper with the rod or the rod with the reel gripper. Arm 14 defines a hole 30 that receives rod 26a as arm is lowered toward component reel 24. Disk 80 is attached to arm 14 by mechanical fasteners 86. Disk supports a linear actuator 82 on each side of arm 14. Linear actuators 82 are attached to the disk 80 by mechanical fasteners and are actuatable to move jaws 40a toward and away from rod 26a. For example, each linear actuators 82 can have a cylinder attached to a respective jaw 40a at one distal end of the cylinder. The linear actuator can extend or retract its cylinder in a direction generally parallel to the length of arm 14 to move its respective jaw 40a in the same direction.

While a number of examples have been described for illustration purposes, the foregoing description is not intended to limit the scope of the invention, which is defined by the scope of the appended claims. There are and will be other examples and modifications within the scope of the following claims.

What is claimed is:

1. A method of picking a top component reel from a stack of component reels, the method comprising:
   lowering a picking arm over a rod extending through the stack of component reels to above a top component reel of the stack, the picking arm comprising a gripper positioned such that, with the picking arm lowered, the rod extends through the gripper of the picking arm;
   aligning the rod with respect to the picking arm, the aligning comprising moving the rod with respect to the picking arm, the moving comprising moving the rod with a movable portion of the picking arm;
   with the rod aligned, inserting a portion of the gripper into a hole defined in the top component reel;
   actuating the gripper to engage opposing inner surfaces of the top component reel at the hole of the top component reel; and
   with the gripper engaging the opposing inner surfaces, raising the picking arm to lift the top component reel from the stack of component reels.

2. The method of claim 1, wherein the movable portion of the picking arm comprises a plurality of tabs positioned such that, with the picking arm lowered, the rod extends through the tabs, and wherein aligning the rod comprises actuating the tabs to engage the rod and align the rod with respect to the picking arm.

3. The method of claim 2, wherein the tabs comprise gripping tabs of the gripper.

4. The method of claim 3, wherein aligning the rod comprises actuating the gripping tabs to dispose the gripping tabs within respective longitudinal grooves of the rod to align the rod through engagement of the grooves.

5. The method of claim 4, wherein inserting a portion of the gripper into the hole of the top component reel comprises continuing to lower the picking arm as the gripping tabs are disposed within respective longitudinal grooves of the rod to insert the gripping tabs into the hole of the top component reel.

6. The method of claim 3, wherein the gripper comprises two opposing jaws each comprising a gripping tab arranged to fit within a respective longitudinal groove of the rod, and wherein actuating the gripper comprises expanding a gap between the jaws such that each gripping tab moves from a respective groove of the rod to engage a respective one of the opposing inner surfaces.

7. The method of claim 4, wherein the rod comprises a minimum web thickness, measured between bases of the longitudinal grooves, of less than about 40% of the diameter of the rod.

8. The method of claim 2, wherein the tabs comprise alignment tabs disposed between the gripper and the picking arm.

9. The method of claim 8, wherein the alignment tabs comprise a first pair of opposing, parallel tabs disposed above a second pair of opposing, parallel tabs, and wherein the first pair of tabs extends in a direction perpendicular to the second pair of tabs.

10. The method of claim 9, wherein actuating the alignment tabs to align the rod comprises moving at least one of two opposing tabs to narrow a gap between the two opposing tabs.

11. The method of claim 8, wherein the alignment tabs comprise rollers.

12. The method of claim 8, wherein the gripper comprises two opposing jaws each comprising an arched gripping tab, and wherein actuating the gripper comprises expanding a gap between the two opposing jaws such that each gripping tab engages a respective one of the opposing inner surfaces.

13. The method of claim 12, further comprising, prior to inserting the portion of the gripper into the hole of the top component reel, actuating the two opposing jaws to narrow a gap between the two respective gripping tabs to embrace the rod with the gripping tabs.

14. The method of claim 1, wherein the picking arm comprises an aperture configured to receive the rod as the picking arm is lowered over the rod.

15. The method of claim 14, wherein the movable portion comprises gripping tabs, and aligning the rod comprises actuating the gripping tabs to align the rod with respect to the aperture of the picking arm.

16. The method of claim 1, wherein the rod extends through aligned holes of the stack of component reels.

17. The method of claim 1, wherein the rod extends through center holes of the stack of component reels.

18. The method of claim 1, wherein the hole of the top component reel comprises a center hole.

19. The method of claim 1, wherein inserting a portion of the gripper into the hole of the top component reel comprises continuing to lower the picking arm to insert a portion of the gripper into the hole of the top component reel.

20. A method of picking a top component reel from a stack of component reels, the method comprising:
   lowering a picking arm over a rod defining longitudinal grooves and extending through the stack of component reels to above a top component reel of the stack, the arm comprising a gripper positioned such that, with the picking arm lowered the rod extends through the gripper of the picking arm;

positioning a portion of the gripper substantially within the grooves;

inserting the portion of the gripper into a hole of the top component reel by moving the portion of the gripper along the grooves;

actuating the gripper to engage opposing inner surfaces of the top component reel at the hole of the top component reel; and with the gripper engaging the opposing inner surfaces, raising the picking arm to lift the top component reel from the stack of component reels.

21. The method of claim 20, wherein the gripper comprises two opposing jaws each comprising a gripping tab, and wherein positioning a portion of the gripper substantially within the grooves comprises positioning the gripping tabs substantially within the grooves of the rod.

22. A component reel picking system, comprising:
a base configured to support a vertical stack of component reels;
a rod extending from the base and positioned to extend through aligned holes of a vertical stack of component reels supported on the base; and
a component reel pick assembly comprising
a controllably movable picking arm;
a plurality of tabs carried by the picking arm, the tabs spaced apart to receive the rod therebetween as the picking arm is lowered over a distal end of the rod, the tabs actuatable to engage opposite sides of the rod to align the arm and the rod with the picking arm lowered; and
a reel gripper carried by the picking arm and comprising two portions configured to receive the rod therebetween as the arm is lowered, the reel gripper operable to separate the portions to receive the rod, and then to narrow a gap between the portions to insert the portions into a top reel of a vertical stack of reels supported on the base, and then to expand the gap to grip opposing surfaces of the top reel, such that subsequent raising of the arm lifts the top reel from the stack.

23. The component reel picking system of claim 22, wherein the rod comprises two opposite grooves each configured to receive a respective one of the two portions of the reel gripper.

24. The component reel picking system of claim 23, wherein the rod comprises a minimum web thickness, measured between bases of the longitudinal grooves, of less than about 40% of the diameter of the rod.

25. The component reel picking system of claim 22, wherein the plurality of tabs comprise gripping tabs of the reel gripper.

26. The component reel picking system of claim 25, wherein the two portions of the reel gripper comprise two gripping tabs arranged to fit substantially within a respective groove of the rod, and wherein the reel gripper is operable to expand a gap between the gripping tabs such that each of the two gripping tabs moves away from the respective groove to engage a respective one of the opposing surfaces of the top reel.

27. The component reel picking system of claim 22, wherein the tabs comprise two sets of opposing alignment tabs disposed between the reel gripper and the picking arm, a first set of alignment tabs disposed above a second set of alignment tabs, the first set of alignment tabs extending in a direction perpendicular to the second set of alignment tabs such that the rod extends between each set of tabs when the tabs receive the rod.

28. The component reel picking system of claim 27, wherein the alignment tabs comprise rollers.

29. The component reel picking system of claim 22, wherein the reel gripper comprises two opposing jaws each comprising one of the two portions of the reel gripper, and wherein the reel gripper is operable to expand a gap between the jaws such that each of the two portions engages a respective one of the opposing surfaces of the top reel.

30. The component reel picking system of claim 22, wherein the picking arm comprises an aperture configured to receive the rod as the picking arm is lowered over the distal end of the rod.

31. The component reel picking system of claim 30, wherein the tabs are actuatable to aligning the rod with respect to the aperture of the picking arm.

32. The component reel picking system of claim 22, wherein the rod extends through center holes of the vertical stack of component reels.

33. The component reel picking system of claim 22, wherein the hole of the top reel comprises a center hole.

34. The component reel picking system of claim 22, wherein the rod comprises a diameter of between 6 millimeters and 8 millimeters.

35. A component reel picking system, comprising:
a base configured to support a vertical stack of component reels;
a rod extending from the base and positioned to extend through aligned holes of a vertical stack of component reels supported on the base; and
a component reel pick assembly comprising
a controllably movable picking arm; and
a reel gripper carried by the picking arm and comprising
a plurality of fingers spaced apart to receive the rod therebetween as the arm is lowered, the fingers controllably movable to engage opposite sides of the rod to align the rod with the picking arm; and
opposing gripping tabs extending downward and movable between a closed position, in which the tabs fit within a central hole of a top reel of the vertical stack on either side of the rod, and an open position in which outer surfaces of the tabs grip the top reel within the central hole to lift the top reel from the stack with the picking arm.

36. The component reel picking system of claim 35, wherein the picking arm comprises an aperture configured to receive the rod as the picking arm is lowered over a distal end of the rod.

37. The component reel picking system of claim 36, wherein the fingers are actuatable to aligning the rod with respect to the aperture of the picking arm.

38. The component reel picking system of claim 35, wherein the fingers comprise two opposing sets of fingers disposed on a same plane to receive the rod between the two sets of fingers, each set of fingers comprising two pivotable fingers connected to a common pivot and configured to pivot in opposite directions about the pivot to align the rod.

39. The component reel picking system of claim 38, wherein the gripping tabs move to the closed position as the fingers pivot to align the rod.

* * * * *